United States Patent
Ramesh et al.

(10) Patent No.: US 7,222,034 B2
(45) Date of Patent: May 22, 2007

(54) IN-CIRCUIT MEASUREMENT OF SATURATION FLUX DENSITY BSAT, COERCIVITY HC, AND PERMIABILITY OF MAGNETIC COMPONENTS USING A DIGITAL STORAGE OSCILLOSCOPE

(75) Inventors: P. E. Ramesh, Bangalore (IN); Godfree Coelho, Bangalore (IN)

(73) Assignee: Tektronix, Inc., Beaverton, OR (US)

( * ) Notice: Subject to any disclaimer, the term of this patent is extended or adjusted under 35 U.S.C. 154(b) by 178 days.

(21) Appl. No.: 10/943,602

(22) Filed: Sep. 17, 2004

(65) Prior Publication Data
US 2005/0184736 A1   Aug. 25, 2005

Related U.S. Application Data

(60) Provisional application No. 60/504,159, filed on Sep. 19, 2003.

(51) Int. Cl.
*G06F 19/00* (2006.01)
(52) U.S. Cl. .................. 702/65; 324/200; 324/600
(58) Field of Classification Search .................. None
See application file for complete search history.

(56) References Cited

U.S. PATENT DOCUMENTS

| | | | |
|---|---|---|---|
| 4,720,778 A | | 1/1988 | Hall |
| 5,122,742 A | * | 6/1992 | Hoffman et al. ............ 324/209 |
| 5,241,269 A | | 8/1993 | Kamiya |
| 5,574,363 A | * | 11/1996 | Jagielinski .................. 324/204 |
| 6,304,473 B1 | | 10/2001 | Telefus |
| 6,348,780 B1 | | 2/2002 | Grant |
| 6,396,718 B1 | * | 5/2002 | Ng et al. ................. 363/21.07 |
| 6,469,491 B1 | | 10/2002 | Schultz |
| 6,584,598 B2 | | 6/2003 | Rao et al. |
| 6,856,127 B1 | * | 2/2005 | Ramesh et al. ............. 324/102 |
| 6,876,936 B2 | * | 4/2005 | Ramesh et al. ............... 702/66 |
| 6,931,353 B2 | * | 8/2005 | Blazek ....................... 702/182 |
| 6,967,551 B2 | * | 11/2005 | Natsumeda et al. ........ 335/284 |
| 6,995,643 B2 | * | 2/2006 | Fujiwara et al. ............ 336/110 |
| 2002/0180458 A1 | * | 12/2002 | Ho et al. .................... 324/623 |
| 2003/0212964 A1 | | 11/2003 | Rao et al. |
| 2005/0017707 A1 | * | 1/2005 | Ramesh et al. ............. 324/102 |
| 2005/0151609 A1 | * | 7/2005 | Natsumeda et al. ........ 335/284 |
| 2005/0184736 A1 | * | 8/2005 | Ramesh et al. ............. 324/522 |

FOREIGN PATENT DOCUMENTS

| | | |
|---|---|---|
| WO | WO 99/10973 A1 | 3/1999 |
| WO | WO 00/39907 A1 | 7/2000 |

OTHER PUBLICATIONS

Chung et al., "Analysis of Buck-Boost Converter Inductor Loss Using a Simple Online B-H Curve Tracer", IEEE, 2000.*

* cited by examiner

Primary Examiner—Patrick J. Assouad
(74) Attorney, Agent, or Firm—Thomas F. Lenihan

(57) ABSTRACT

An oscilloscope performs an in-circuit measurement of voltage across, and current through, a core winding of an inductor, and derives the actual B and H values with n number of turns, receives data indicative of the magnetic length of the circuit, and plots the B_H curve. The oscilloscope then derives the value of Saturation flux density (Bsat), Remnant flux density (Br), Permeability ($\mu$), and Coercivity (Hc) from this B-H plot. Characterizing the operating region of the magnetic component while it operates in a Switch Mode Power Supply (SMPS) under test, provides information concerning the stability of the power supply that was heretofore unavailable.

9 Claims, 5 Drawing Sheets

| ITEM | SYMBOL | UNIT | CONDITIONS (°C) | NC-7 (PDF 280K) |
|---|---|---|---|---|
| INITIAL PERMEABILITY | $\mu_i$ | — | 23 | 7000± 25% |
| SATURATION FLUX DENSITY | Bs | mT | 23 | 440 335 (70°C) |
| REMANENT FLUX DENSITY | Br | mT | 23 | 120 165 (70°C) |
| COERCIVITY | Hc | A/m | 23 | 6.4 7.8 (70°C) |

IN-CIRCUIT MEASUREMENT OF SATURATION FLUX DENSITY BSAT, COERCIVITY HC, AND PERMIABILITY OF MAGNETIC COMPONENTS USING A DIGITAL STORAGE OSCILLOSCOPE

CLAIM OF PRIORITY

The subject application claims priority from U.S. Provisional Patent Application No. 60/504,159 entitled, Measuring Saturation Flux Density Bsat, Coercivity Hc, Permiability of the Magnetic Components in an In-circuit Operation Using DSO (Ramesh, et al.), filed 19 Sep. 2003.

FIELD OF THE INVENTION

The subject invention generally concerns measurement of magnetic components and specifically concerns in-circuit measurements of magnetic components using a DSO.

BACKGROUND OF THE INVENTION

Switching power supplies are aimed to operate at the maximum efficiency by operating at the higher switching frequency. This makes the design deviations and operating tolerance of the switching frequency stringent The operating switching frequency and its stability depends upon the magnetic components used as the part of Switching (Oscillating) element in the switch mode power supply.

Switching Power Supplies are expected to have very high reliability at different operating conditions, such as, Power-On state, Steady state, Load change-over and settling-down, Based design methodologies such as topologies, and Type of converter such as AC/DC and DC/DC.

During these modes of operation the current and voltage characteristics change. It is expected that magnetic components such as inductors, coupled inductors and transformers operate in stable condition such that power supply is not driven to an unstable condition.

For optimum performance, designers generally design magnetic components such as transformers and Inductors using the magnetic characteristics curve, popularly known as a hysteresis curve of the core material, that is supplied by magnetic component manufacturers. Each magnetic component is designed based on the operating voltage, current, topology, and type of converter, In an attempt to ensure that it will operate in the linear region of its hysteresis curve. Unfortunately, there is no mechanism available to verify the design under actual operating conditions.

The operating region of the magnetic components determines the stability of the switching power supply. The power supply operating voltage and current characteristics also depend on Power-on state, Steady state, Load-change state, Type of topology, and Type of converter.

It is extremely difficult, in view of the different scenarios of signal characteristics, to design a magnetic component and ensure that it will operate in a linear region.

What is needed is an apparatus and method to observe and measure the B-H characteristics of the magnetic component in an in-circuit operation.

SUMMARY OF THE INVENTION

An oscilloscope according to the subject invention performs an in-circuit measurement of voltage across, and current through, a core winding of an inductor, and derives the actual B and H values with n number of turns, receives data indicative of the magnetic length of the circuit, and plots the B_H curve. The oscilloscope then derives the value of Saturation flux density (Bsat), Remnant flux density (Br), Permeability (μ), and Coercivity (Hc) from this B-H plot.

It is herein recognized that characterizing the operating region of the magnetic component while it operates in a Switch Mode Power Supply (SMPS) under test, provides information concerning the stability of the power supply that was heretofore unavailable.

In a first aspect of the invention, the operating point of a magnetic component may be viewed by plotting variation of the Flux density against magnetic field strength (Magnetomotive force).

In a second aspect of the invention, B-H characteristics may be quantified by measuring Peak flux density, remnant flux density, permeability, and coercivity.

In a third aspect of the invention the cycle related to maximum flux density can be selected and used to calculate permeability, for analyzing inductance variation in in-circuit operation.

A fourth aspect of the invention is the ability to calculate the operating DC flux density and positioning the curve at the operating point and plot B-H characteristics during CCM, DCM and while switching between CCM to DCM and DCM to CCM in an in-circuit operation.

A fifth aspect of the invention is the ability to characterize complex magnetic components having multiple windings such as, transformers or coupled inductors.

A sixth aspect of the invention is the ability to verify the actual behavior of a magnetic component, under in-circuit operating conditions.

DETAILED DESCRIPTION OF THE EMBODIMENTS

Figure 1:
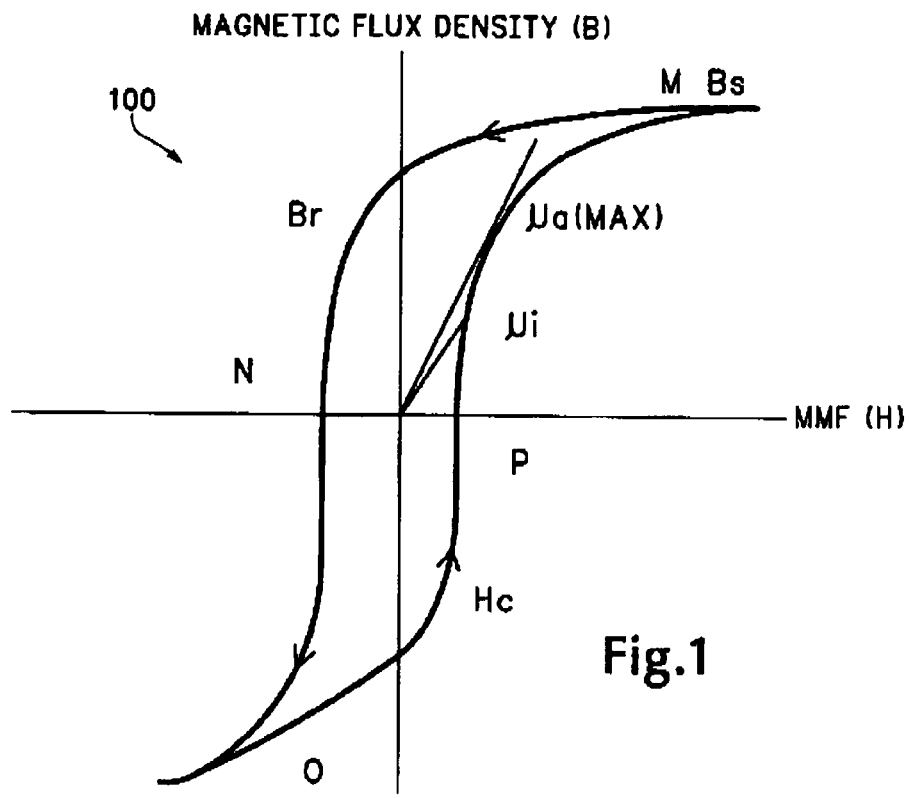
FIG. 1 is a plot of a hysteresis curve for a typical soft magnetic material, as know from the prior art.

Some definitions that may be useful in understanding the invention are:

Magnetic Field Strength (H): Magnetic field employed to induce magnetic flux in the material under test. Units are Amperes/meter Saturation Flux Density (Bs): Maximum magnetic flux density that can be induced in the material regardless of the magnitude of the externally applied field H.

Remnant Flux Density (Br): Induced magnetic flux density that remains in the material after the externally applied magnetic filed (H) is returned to zero during the generation of the Hysteresis loop.

Coercive Force (Hc): Value of H found at the intercept of the H-axis with the Hysteresis loop. This represents the external field required to cause the induced flux density (B) to reach zero during the measurement cycle of a Hysteresis loop. HC is symmetrical with positive and negative axis Initial Permeability ($u_i$): The ratio of induced magnetic flux density (B) to an applied field (H) as H approaches zero. It is ratio of B to H at any point on the Hysteresis loop.

Maximum Amplitude Permeability: Maximum ratio of B to H on the first quadrant positive cycle of the Hysteresis loop. It is the slope drawn from the Origin.

It is herein recognized that characterizing the magnetic properties of materials by measuring Saturation flux density (Bsat), Coercivity (Hc), Permeability for magnetic components in an In-circuit operation, enables engineers, such as Switch Mode Power Supply (SMPS) designers, to better select appropriate magnetic components for their designs.

Use of the subject invention allows a magnetic component designer to view the operating point of the magnetic component by plotting the variation of the Flux density against the magnetic field strength (Magnetomotive force). It also allows the designer to quantify the B-H characteristics of the component by measuring peak flux density, remnant flux density, permeability, and coercivity, all of which helps in analyzing the stability of a power supply under test Use of the subject invention allows a magnetic component designer to select a cycle related to maximum flux density and calculate permeability, which helps to check inductance variation in in-circuit operation. It also allows the designer to calculate the operating DC flux density, to position the curve at the operating point, and to plot B-H characteristics during CCM, DCM and while switching between CCM to DCM and DCM to CCM in an in-circuit operation. One skilled in the art will know that CCM means Continuous Current Mode operation wherein a current through the inductor never becomes zero; it means carry DC current. One skilled in the art will also know that DCM mean Discontinuous Current Mode operation wherein a current through the inductor does become zero. This term indicates that the current through the inductor can change from DCM to CCM as the operating load varies on the power supply. DC flux density Bdc also varies with operating load on the power supply.

Use of the subject invention allows a magnetic component designer to characterize complex magnetic components having multiple windings (e.g., transformers, coupled inductors). It also allows the designer to verify the actual behavior of the magnetic component, during in-circuit operating condition, thus enabling the designer to optimize the design.

Consider a coil is wound on a closed ferromagnetic core, or PERM Alloy ring, or amorphous core. Depending upon the excitation levels applied, its cross sectional area, and the number of turns, the core can be driven into saturation by an applied current. It is herein recognized that one can measure the voltage across the core winding and the current through it, and derive the actual B, H values with n number of turns, and the length of the magnetic circuit, then plot a B-H curve. It is then possible to derive the value of Saturation flux density (Bsat), Remnant flux density (Br), Permeability ($\mu$), and Coercivity (Hc) from this plot.

Referring to FIG. 1, a B-H curve is displayed showing Saturation Flux Density (Bs), Remnant Flux Density (Br), Coercive Force (Hc), Initial Permeabilty ($\mu_i$), and Maximum Amplitude Permeability ($\mu_{a(Max)}$). It should be noted that the data waveform (B-H curve) of FIG. 1 starts from the maximum value of H (i.e., at point M) and decreases, then increases again along a path designated M-N-O-P. As noted above, FIG. 1 is a typical B-H curve (i.e., hysteresis plot) for a soft magnetic material.

When testing a single winding inductor (not shown), an engineer would connect a differential voltage probe across the inductor and connect a current probe to measure the current through the inductor.

Figure 2:
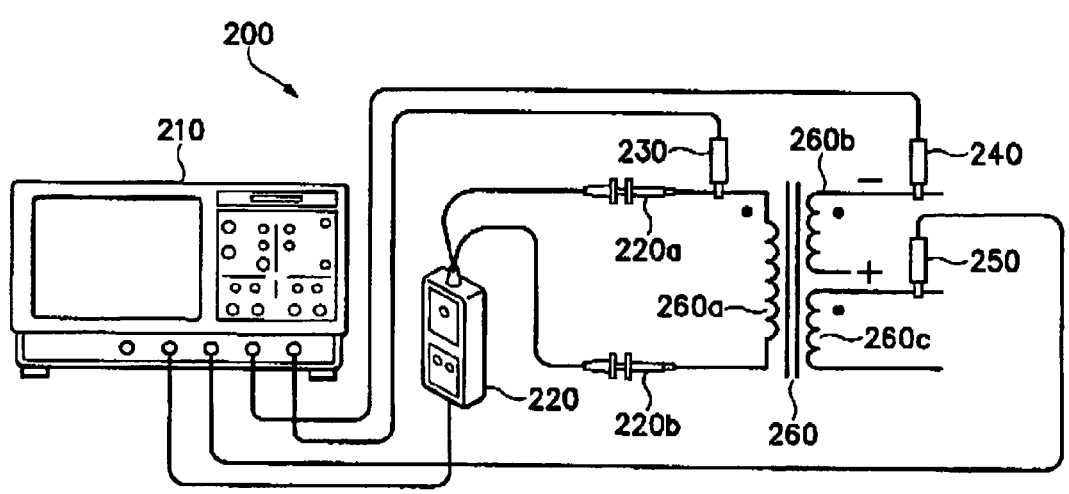
FIG. 2 is an illustration of a test setup for measuring B and H, as known from the prior art.

A measurement setup arrangement 200 for testing a transformer is shown in FIG. 2. Referring to FIG. 2, a four-channel oscilloscope 210, such as a Tektronix TDS7054B or TDS5104 Digital Phosphor Oscilloscope (DPO), manufactured by Tektronix, Inc., Beaverton, Oreg., is coupled to a transformer 260 for measurement of the magnetic characteristics of transformer 260. It is to be understood that transformer 260 is part of a user's circuit (not shown) and receives energizing current from the remainder of the user's circuit, as indicated by the arrows associated with transformer 260.

A differential probe 220, such as a Tektronix P5205 differential probe, has its probes 220a and 220b coupled to primary winding 260a of transformer 260 for providing a non-ground-referenced measurement of the voltage developed across primary winding 260a to channel 1 of oscilloscope 210, via a single-ended output of differential probe 220. In addition, a first current probe 230 is coupled to channel 2 of oscilloscope 210 for measuring the current through primary winding 260a, a second current probe 240 is coupled to channel 3 of oscilloscope 210 for measuring the current through secondary winding 260b, and a third current probe 250 is coupled to channel 4 of oscilloscope 210 for measuring the current through secondary winding 260c.

The measured current at each secondary winding 260b, 260c is added with the measured current through primary winding 260a in accordance with it's respective turns ratio. That is:

if Ip equals the current through primary winding 260a, having N turns;

if I1 equals the current through secondary winding 260b; having N1 turns; and if I2 equals the current through secondary winding 260c; having N2 turns; then:

the Magnetizing Current Iz is defined by the following equation:

$$Iz = Ip + \frac{N1}{N} * I1 + \frac{N2}{N} * I2$$

In operation, an engineer characterizes magnetic materials of either an inductor or a transformer in the following manner. He first winds a magnetic core with a known number of turns of wire, and excites the core winding with an external voltage-controlled and current-controlled source. The engineer then measures the magnetizing voltage across the core winding and the current through the windings. The engineer then processes the acquired data with software according to the subject invention as described in the flow diagram of FIG. 3 to derive and plot the BH characteristic of the core.

Figure 3:
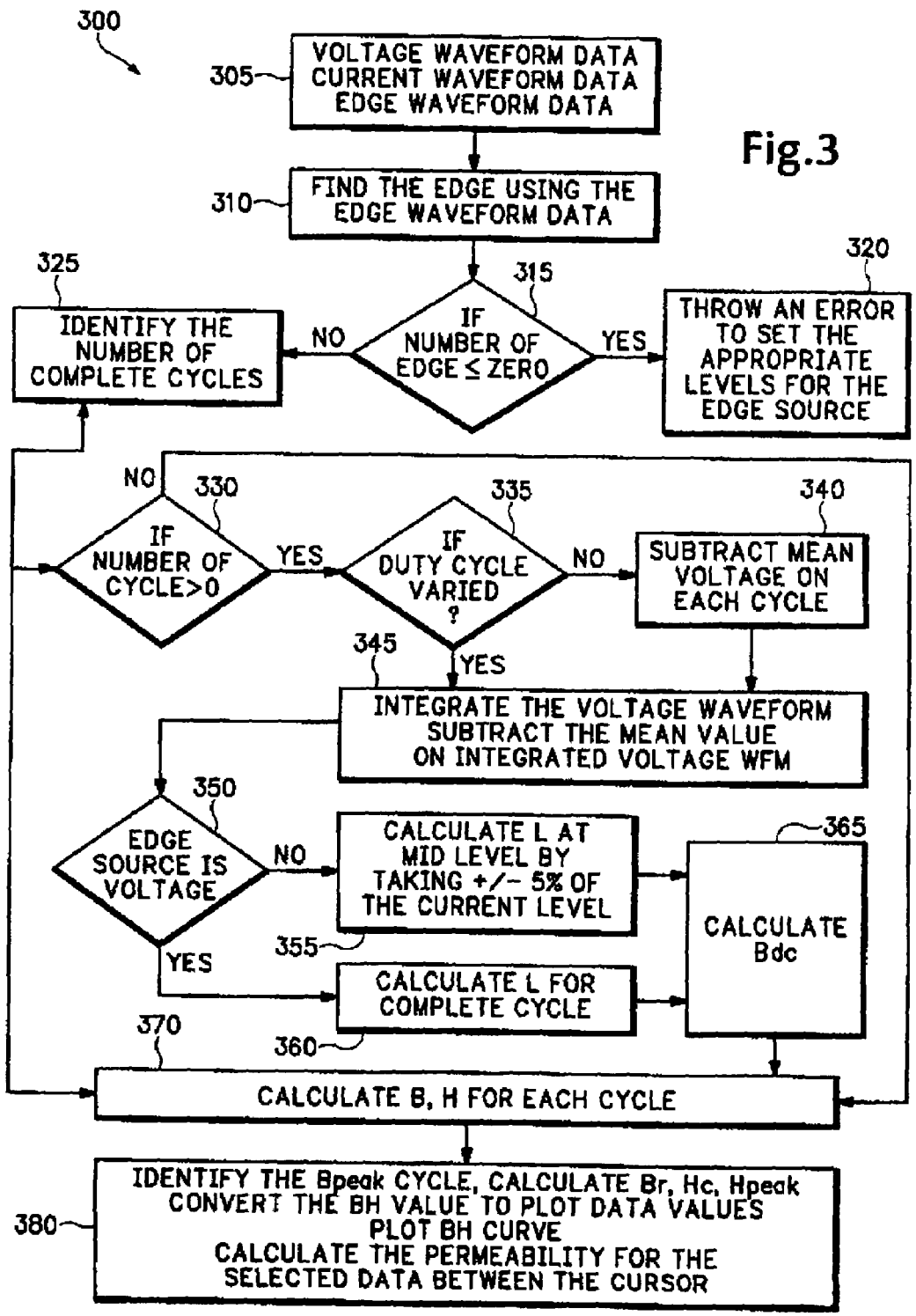
FIG. 3 is a flowchart of a method of measuring a BH characteristic of a magnetic component operating In-circuit, in accordance with the subject invention.

FIG. 3 shows a flowchart 300 of a program for performing an in-circuit measurement of the B-H characteristic of a magnetic component in accordance with the subject invention. The program is entered at step 305 with measurement data of voltage measurements, current measurements, waveform edge measurements, and user-entered data indicative of the number of turns and path length, and then advances to step 310 wherein waveform edges are identified using the edge waveform data. At step 315, the number of waveform edges is determined. If the number is zero, then an error message is generated at step 320. A non-zero number causes the program to advance to step 325 wherein a complete number of cycles is identified, and passed to step 330 wherein a check is performed to see if all cycles in the waveform have been processed.

If cycles remain to be processed, the YES path is taken to step 335 wherein a check is made to see if the present duty cycle has varied from earlier cycles. If not, the NO path is taken to step 340 wherein the mean value of voltage on each cycle is subtracted, and the program advances to step 345. If, at decision step 335, the duty cycle had varied, then the program would have advanced directly to step 345. At step 345, the voltage waveform is integrated, and the mean value of the integrated voltage waveform is subtracted from the result. If, at step 350, the edge source is voltage data, then the YES path is taken to step 360 wherein the value of the inductance L is calculated for the complete cycle. Otherwise, the NO path is taken to step 355 wherein the inductance L is calculated at mid-level by taking ±5% of the level of the current. After performing either step 355 or step 360, the program advances to step 365 for calculation of Bdc.

The program then decrements the number of cycles and loops back to step 330 to see if it is done (i.e., to see if any cycles remain to be processed). If, at step 330, no cycles remain, then the program advances to step 370, calculates B and H for each cycle then proceeds to step 380. In step 380, the following procedures are performed: Identification of Bpeak cycle and calculation of Br, Hc, and Hpeak. The BH values are converted to Plot data values, and the BH curves are plotted on the display screen of the oscilloscope. Finally, the Permiability is computed for the data between the cursors on screen.

In the above flowchart steps, calculation of the B Value from the measured voltage data is accomplished by identifying each cycle using the edge source data. Assume, for purposes of this explanation, that there are "m" number of complete cycles on the acquired waveform Further assume that each cycle has "q" number of data points.

If the duty cycle is varied (see step 335), the mean average value of the voltage is not zero for each cycle, whereas it had been zero for over a set of cycles. In this case, the voltage waveform is not subtracted from its mean value before doing the integration.

Assume that the mean voltage for the $k_{th}$ cycle is $$Vmean_k = \frac{1}{q}\sum_{i=1}^{i=q} V(i)$$

Where i varies from 1 to q data points, Where Vk(t) is the normalized voltage waveform data $$Vk(t)=V(i)-Vmean_k$$

of Kth cycle

Continuos Integration of the Voltage waveform is performed for the $k_{th}$ cycle where k th cycle $$\phi(t)_k = \int Vk(t)dt \qquad Eq(1)$$

has 1 to q points and is done for all cycle from 1 to m cycles. $B_k(t)$ is the Flux density of the $k_{th}$ cycle.

$$B_k(t)=\phi_k(t)/N*S \qquad Eq(2)$$

To derive only the changes in the flux density, the calculated flux density is normalized. The normalized flux density for the $k_{th}$ cycle is $B_{meank}$ $$Bmean_k = \frac{1}{q}\sum_{i=0}^{i=q} B_k(i)$$

Now the normalized flux density of kth cycle is $$Bn_k(t)=B_{k(t)}-B_{meank} \qquad Eq(3)$$

The DC flux density that determines the operating point of the inductor or transformer in an in-circuit operation is calculated for this cycle as $B_{dck}$ The $B_{dck}$ flux density for $k_{th}$ cycle (step 370) is given by $$Bdc_k = \frac{L_k * Iavge_k}{S} \qquad Eq(4)$$

Wherein, $L_k$ is the Inductance derived for that cycle. The value of inductance is calculated with the integral voltage data and current data using the method stated in U.S. Pat. No. 6,876,936 entitled, MEASUREMENT OF INDUCTANCE USING A DIGITAL STORAGE OSCILLOSCOPE UNDER REAL TIME OPERATING ENVIRONMENTS, (Ramesh, et al.), issued Apr. 5, 2005, assigned to the same assignee as the subject invention, and herein incorporated by reference in its entirety.

$Iavge_k$ is the average value of the current for the $k_{th}$ cycle and S is the Core cross sectional area of the magnetic material Bdata of the $k_{th}$ cycle is $$B(t)_k=B_{dck}+B_{nk}(t)$$

H data for the $k_{th}$ cycle is $$Hk(t) = \frac{I_{k(t)*N}}{l} \qquad Eq(6)$$

Where N is the number of turns, l is the length of the magnetic path. Values for N and l are entered by the user.

B and H values are calculated (see step 370) for all the complete number (m) of cycles in the entire acquisition record using equations Eq(1) to Eq(6).

The cycle that has maximum value of B(t) is identified and this cycle is known as the peak cycle "p". (Step 380). The value of Hc, Br is calculated on the data of the Peak Cycle form Bp(t) and Hp(t) data. (Step 380). All the cycles are plotted on the plot and Bp(t) data for the p cycle is preferably colored differently to show the customer that the maximum B has occurred on this cycle. (Step 380)

Permeability Calculation:

In the plot on the screen of the oscilloscope, there is a provision to select the data point between the cursor 1 and a cursor in an anti-clockwise direction of the plot.

The slope of the data selected between the cursors on the B and H peak cycle is calculated as follows. Assume that there are "y" data points between the Cursors on the peak cycle.

Find $H_{av}=(H_1+H_2+\ldots H_y)/Y$ $B_{av}=(B_1+B_2+\ldots B_y)/Y$ $H_{normi}=H_i-H_{av}$, $i=1\ldots Y$ $B_{normi}=B_i-B_{av}$, $i=1\ldots Y$ $B/H=\text{SUM}(H_{norm1}*B_{norm1}+H_{norm2}*B_{norm2}+\ldots +H_{normY}*B_{normY})/\text{SUM}(H_{norm1}*H_{norm1}+H_{norm2}*H_{norm2}+\ldots H_{normY}*H_{normY})$ Permeability $\mu=B/H$ The results of validation of the BH property Measurements include Bpeak, Hmax, Br, Hc, Permeability and Ripple Current. Results of validations are divided into two sections, one with Stimulus, and one using prototype kits. The validations are for a) Single Winding
b) Multiple Winding (Simultaneous and non-simultaneous transformers)

Section 1 Stimulus Verification and Validation

Material: NC-7

Manufacturer: Nippon Ceramics Co Ltd

This material is wire-wound and the physical properties are

| | |
|---|---|
| Area | 13.58 usqmtr |
| Length | 0.0265 mtr |
| Number of Turns | 50 |

Figures 4, 5:
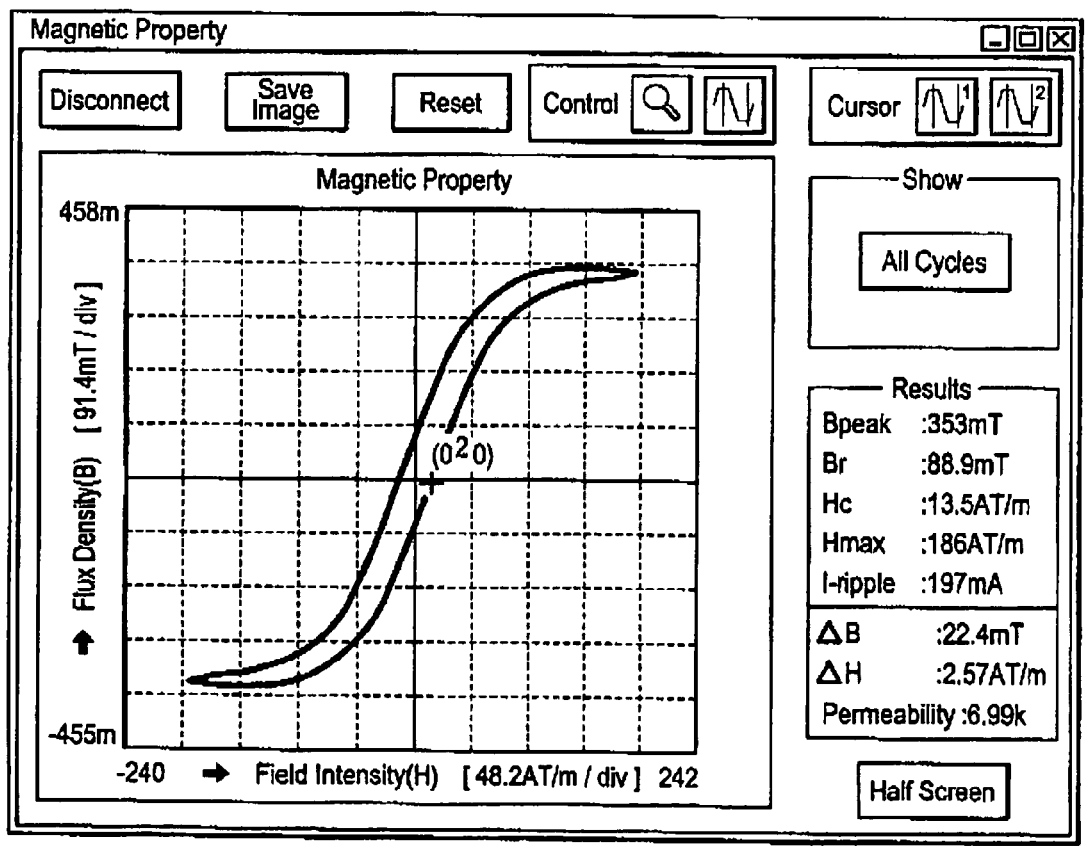
FIG. 4 is a chart of the magnetic properties of a particular material.
FIGS. 5, 6, and 7 are screenshots useful for understanding the invention.

A data sheet for this material is shown in FIG. 4.

The A F G (Arbitrary Function Generator) Setup is as follows:

A stimulus signal having the following characteristics is applied to the inductor.

Amplitude=6 Volts
Frequency=1 KHz
Shape=Triangular Wave

The results, as measured by the inventive apparatus and method, are shown in the screenshot of FIG. 5.

A second example is as follows:

| | |
|---|---|
| Material: 3F3 type | |
| Manufacturer: SIEMENS (Feroxcube) | |
| Units: SI | |
| Area | 37e-6 |
| Length | 29.2e-3 |
| Number of Turns | 18 |

Figure 6:
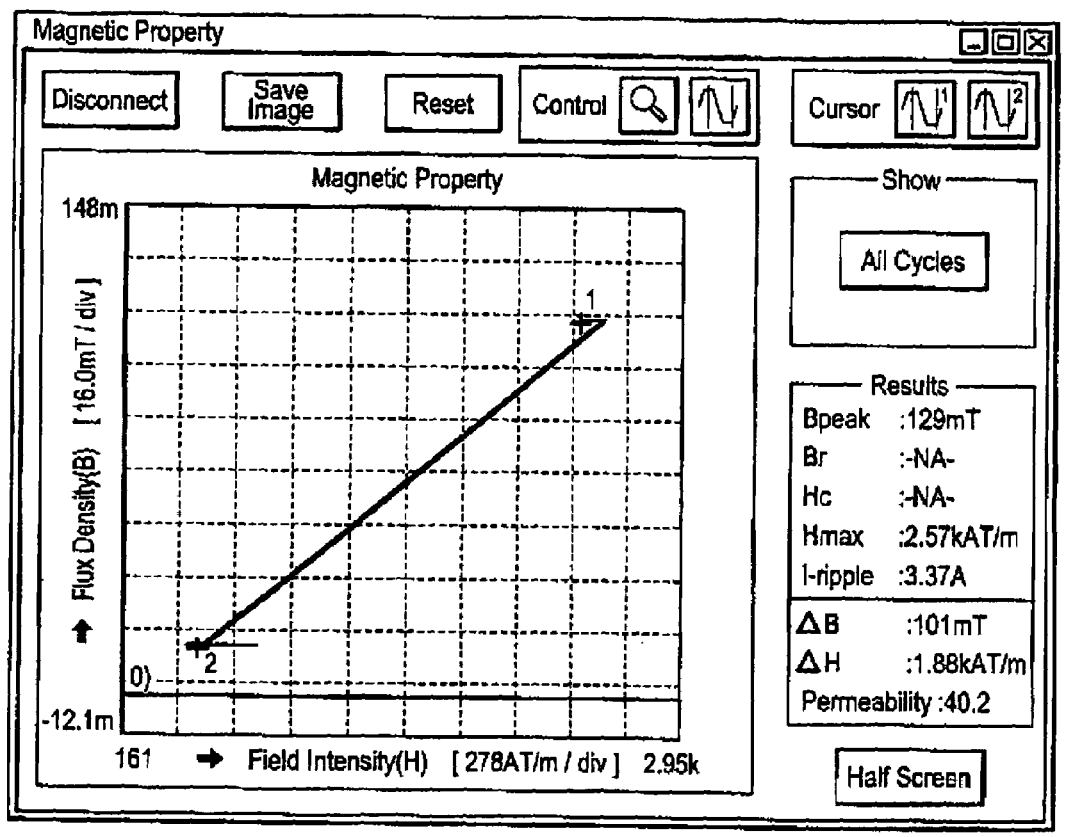

The results for the 3F3 material, as measured by the inventive apparatus and method, are shown in the screenshot of FIG. 6.

Results Verification for Multiple-winding Inductors

The Bill of Materials (BOM) of manufacturer provides the value of inductance. Then, the value of delta, Relative permeability are theoretically calculated and verified with calculated results.

Here, for the given value of Inductance, the delta B flux is calculated, then the permeability is calculated theoretically and is compared with measured results.

| IRSMPS Transformer Proto type Power supply | |
|---|---|
| Material Type Part Number | EFD25-1S-10P |
| Material Type | |
| Cross Section Area Ae | 58e-6 sqmtr |
| Magnetic Length | 57e-3 mtr |
| Number of primary Turns | 58 |
| Number of Secondary turns | 6 |

Figure 7:
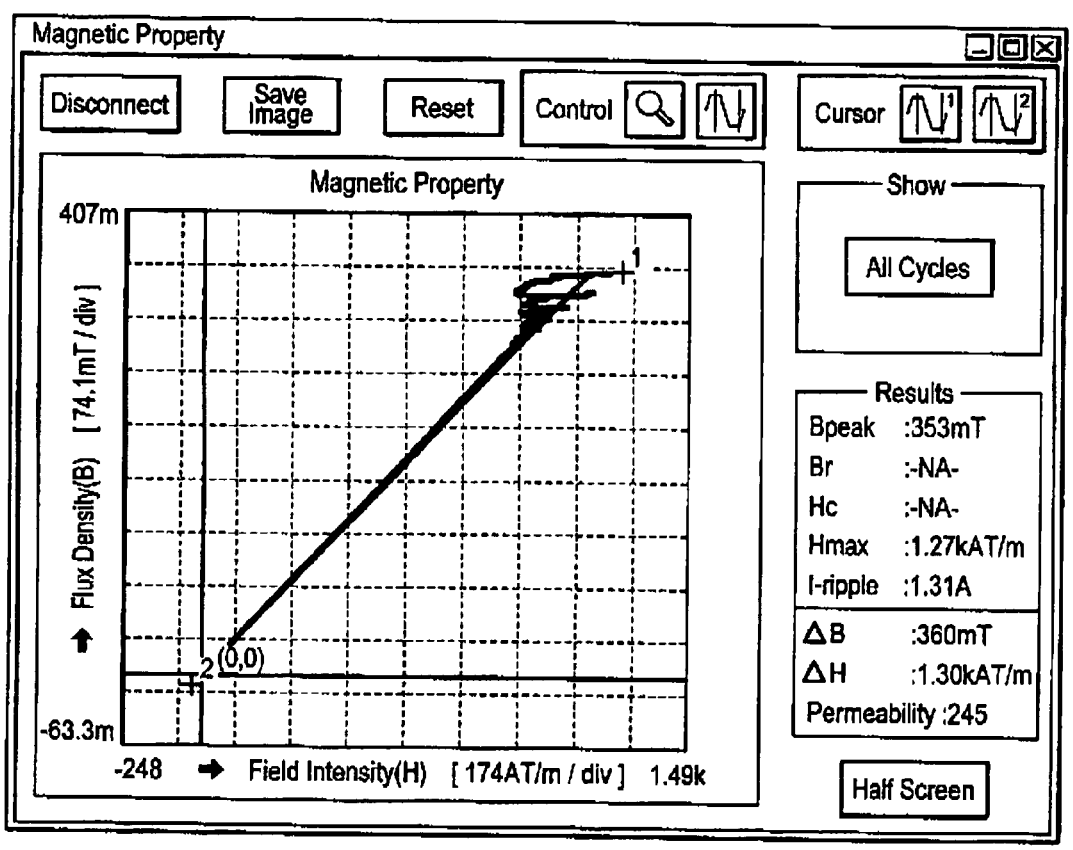

A DSO screen shot of the results, as provided by an apparatus and method of the subject invention, is shown in FIG. 7.

Calculations:

Inductance=1 mH $\Delta I = I\text{max} - I\text{min} = 1.31$ $$L = \frac{\Delta B * N * Ae}{\Delta I}$$

$L=1$ mH, $N=58$, $Ae=58.1e-6$ sqmtr $\Delta B=(1e-3*1.31)/(58*58e-6)$ $\Delta B=389$ mT.

Note, from FIG. 7, that the measured value of $\Delta B$ is 353 mT, and compares favorably with the theoretical calculation of $\Delta B$ of 389 mT.

Permeability can be derived from the measured value of inductance $$L = \frac{\mu_0 * \mu r N^2 A}{l}$$

$\mu_0 * \mu_r=(1e-3*57e-3/58*58*58e-6)=232$. This compares favorably with the DSO's calculated permeability for the given range of about 245, as shown in the screenshot of FIG. 7.

What has been described is an apparatus and method for in-circuit characterization of the magnetic properties of magnetic materials. The scope of the invention is defined by the following claims.

What is claimed is:

1. A method, suitable for use in an oscilloscope, for performing in-circuit characterization of a magnetic component, said method comprising the steps of:
    a) receiving data indicative of the number of winding turns that are applied to a core of said magnetic component;
    b) receiving data indicative of a length of a magnetic path of said magnetic component;
    c) measuring voltage across, and current through, said winding of said magnetic component;
    d) deriving actual B and H values from said voltage and current measurements, and said data indicative of path length and indicative of said number of turns;
    e) plotting a B-H curve from said data and measurements; and
    f) deriving a value of at least one magnetic parameter from said B-H curve, said magnetic parameter being one of saturation flux density (Bsat), Remnant flux density (Br), Permeability (I), and Coercivity (Hc).

2. The method of claim 1, wherein the operating point of said magnetic component is viewed by plotting variation of Flux density against magnetic field strength (Magnetomotive force).

3. The method of claim 1, further comprising the step of:
g) identifying and selecting a cycle related to maximum flux density; for use in calculating permeability.

4. The method of claim 1, further comprising the steps of:
a) calculating an operating DC flux density;
b) positioning said curve at said operating point; and
c) plotting B-H characteristics during Continuous Current Mode in an in-circuit operation.

5. The method of claim 1, further comprising the steps of:
a) calculating an operating DC flux density;
b) positioning said curve at said operating point; and
c) plotting B-H characteristics during Discontinous Current Mode in an in-circuit operation.

6. The method of claim 1, further comprising the steps of:
a) calculating an operating DC flux density;
b) positioning said curve at said operating point; and
c) plotting B-H characteristics while switching from Continuous Current Mode to Discontinuous Current Mode in an in-circuit operation.

7. The method of claim 1, further comprising the steps of:
a) calculating an operating DC flux density;
b) positioning said curve at said operating point; and
c) plotting B-H characteristics while switching from Discontinuous Current Mode to Continuous Current Mode in an in-circuit operation.

8. The method of claim 1 wherein said magnetic component is a complex magnetic component having multiple windings such as a transformer or a coupled inductor.

9. A method, suitable for use with an oscilloscope, for verifying in-circuit behavior of a magnetic component, said method comprising the steps of:
a) receiving data indicative of the number of winding turns that are applied to a core of said magnetic component;
b) receiving data indicative of a length of a magnetic path of said magnetic component;
c) receiving data indicative a nominal value of a magnetic parameter of said magnetic component;
d) measuring voltage across, and current through, said winding of said magnetic component;
e) deriving actual B and H values from said voltage and current measurements, and said data indicative of path length and indicative of said number of turns;
f) plotting a B-H curve from said data and measurements;
g) deriving a value of at least one magnetic parameter from said B-H curve, said magnetic parameter being one of saturation flux density (Bsat), Remnant flux density (Br), Permeability (I), and Coercivity (Hc); and
h) comparing said derived value of at least one magnetic parameter to said received nominal value of said magnetic parameter for verifying actual behavior of said magnetic component, under in-circuit operating conditions.

* * * * *